(12) United States Patent
Kopp et al.

(10) Patent No.: US 12,477,865 B2
(45) Date of Patent: Nov. 18, 2025

(54) OPTOELECTRONIC SEMICONDUCTOR DEVICE WITH CONTACT STRUCTURES AND A REFLECTIVE LAYER ON A FIRST MAIN SURFACE OF A SEMICONDUCTOR LAYER SEQUENCE AND METHOD FOR PRODUCING AN OPTOELECTRONIC SEMICONDUCTOR DEVICE

(71) Applicant: OSRAM Opto Semiconductors GmbH, Regensburg (DE)

(72) Inventors: Fabian Kopp, Tanjung Tokong (MY); Attila Molnar, Gelugor (MY); Ban Loong Chris Ng, Ayer Itam (MY); Cheng Kooi Tan, Bukit Mertajam (MY)

(73) Assignee: OSRAM Opto Semiconductor GmbH, Regensburg (DE)

( * ) Notice: Subject to any disclaimer, the term of this patent is extended or adjusted under 35 U.S.C. 154(b) by 722 days.

(21) Appl. No.: 17/784,129

(22) PCT Filed: Dec. 19, 2019

(86) PCT No.: PCT/EP2019/086383
§ 371 (c)(1),
(2) Date: Jun. 10, 2022

(87) PCT Pub. No.: WO2021/121603
PCT Pub. Date: Jun. 24, 2021

(65) Prior Publication Data
US 2023/0032550 A1    Feb. 2, 2023

(51) Int. Cl.
*H10H 20/816*    (2025.01)
*H10H 20/01*    (2025.01)
(Continued)

(52) U.S. Cl.
CPC .......... *H10H 20/816* (2025.01); *H10H 20/01* (2025.01); *H10H 20/814* (2025.01);
(Continued)

(58) Field of Classification Search
CPC .... H10H 20/816; H10H 20/01; H10H 20/857; H10H 20/8312; H10H 20/814; H10H 20/833; H10H 20/835
See application file for complete search history.

(56) References Cited

U.S. PATENT DOCUMENTS 12,051,768 B2 * 7/2024 Kopp ................... H10H 20/833
2013/0153951 A1    6/2013 Nihei et al.
(Continued)

FOREIGN PATENT DOCUMENTS

DE    102012217533 A1    3/2014
DE    102016119539 A1    4/2018
(Continued)

OTHER PUBLICATIONS

International Search Report issued for the corresponding international patent application No. PCT/EP2019/086383, dated Jun. 15, 2020, 2 pages (for informational purposes only).

*Primary Examiner* — Alonzo Chambliss
(74) *Attorney, Agent, or Firm* — Viering, Jentschura & Partner mbB

(57) ABSTRACT

An optoelectronic semiconductor device may include a semiconductor layer sequence, a directionally reflective layer being arranged on the first main surface of the semiconductor layer sequence, a first contact structure comprising a first current spreading structure arranged on a first surface of a first semiconductor layer of the semiconductor layer sequence, a second contact structure comprising a second current spreading structure arranged on a first surface of a second semiconductor layer of the layer stack, wherein
(Continued)

the first current spreading structure and the second current spreading structure each consist of at least one transparent conductive oxide. Moreover, a method for producing an optoelectronic semiconductor device is described.

16 Claims, 8 Drawing Sheets

(51) Int. Cl.
    *H10H 20/814*     (2025.01)
    *H10H 20/831*     (2025.01)
    *H10H 20/832*     (2025.01)
    *H10H 20/833*     (2025.01)
    *H10H 20/857*     (2025.01)
(52) U.S. Cl.
    CPC ...... *H10H 20/8312* (2025.01); *H10H 20/857* (2025.01); *H10H 20/032* (2025.01); *H10H 20/0364* (2025.01); *H10H 20/833* (2025.01); *H10H 20/835* (2025.01)

(56) References Cited

U.S. PATENT DOCUMENTS

| | | | |
|---|---|---|---|
| 2014/0159091 | A1 | 6/2014 | Hon et al. |
| 2015/0255685 | A1 | 9/2015 | Herrmann et al. |
| 2021/0328106 | A1 | 10/2021 | Kopp et al. |

FOREIGN PATENT DOCUMENTS

| | | | | |
|---|---|---|---|---|
| DE | 102018117018 | A1 | | 1/2020 |
| EP | 3474337 | A1 | | 4/2019 |
| WO | WO-2017222279 | A1 | * 12/2017 | ............ H01L 33/00 |

* cited by examiner

FIG 9

| R [Ohm/sq] | Uf [V] | O (%) |
|---|---|---|
|  | 3.286 | 0.0% |
| 43 | 3.208 | +0.2% |
| 21 | 3.149 | +0.5% |
| 8 | 3.066 | +0.9% |

OPTOELECTRONIC SEMICONDUCTOR DEVICE WITH CONTACT STRUCTURES AND A REFLECTIVE LAYER ON A FIRST MAIN SURFACE OF A SEMICONDUCTOR LAYER SEQUENCE AND METHOD FOR PRODUCING AN OPTOELECTRONIC SEMICONDUCTOR DEVICE

CROSS-REFERENCE TO RELATED APPLICATION

The present application is a national stage entry according to 35 U.S.C. § 371 of PCT application No.: PCT/EP2019/086383 filed on Dec. 19, 2019; which is incorporated herein by reference in its entirety and for all purposes.

TECHNICAL FIELD

This application is related to an optoelectronic semiconductor device as well as a method for producing an optoelectronic semiconductor device. Especially, the optoelectronic semiconductor device is a radiation-emitting semiconductor device, for example an LED.

BACKGROUND

There exist different chip designs which are related by way of example to different mounting technologies. One possible chip design is a flip-chip design, where the chip is mounted upside down and bondpads of different polarity for external electrical contacting are arranged on a same side of a semiconductor body of the chip.

An increasing miniaturization of optoelectronic semiconductor devices requires on the one hand improved electrical contacting of the semiconductor device, for example with respect to current spreading, and on the other hand improved decoupling efficiency. While electrical contacting might be improved by using a metal structure, such a structure might be unfavourable to the decoupling efficiency because of its absorption coefficient.

Objects to be solved within the present application are to specify an improved optoelectronic semiconductor device as well as an improved method for producing an optoelectronic semiconductor device.

SUMMARY

According to at least one embodiment of an optoelectronic semiconductor device, the optoelectronic semiconductor device comprises a semiconductor layer sequence, wherein the semiconductor layer sequence comprises a first semiconductor layer having a first surface, a second semiconductor layer having a first surface, a first main surface and a second main surface opposite to the first main surface. In particular, the first surfaces of the first and second semiconductor layers are at least partly arranged at the first main surface of the semiconductor layer sequence. Moreover, the optoelectronic semiconductor device comprises a directionally reflective layer being arranged on the first main surface. In the context of the present application, "directionally reflective" designates a reflection property which is characterized in that a main part of radiation is reflected in one direction or within a small range of angles.

Furthermore, the optoelectronic semiconductor device comprises a first contact structure for electrically connecting the first semiconductor layer, wherein the first contact structure comprises a first current spreading structure being arranged on the first surface of the first semiconductor layer and partly adjoining the at least one directionally reflective layer. In the context of the present application, "being arranged on" means following in a non-parallel, such as vertical, direction.

In addition, the optoelectronic semiconductor device comprises a second contact structure for electrically connecting the second semiconductor layer comprising a second current spreading structure being arranged on the first surface of the second semiconductor layer and partly adjoining the at least one directionally reflective layer. And the first current spreading structure and the second current spreading structure each consist of at least one transparent conductive oxide. Even though the first current spreading structure and the second current spreading structure each consist of at least one transparent conductive oxide, the structures may contain additional components that do not substantially alter the characteristic physical properties of the transparent conductive oxide(s).

Transparent conductive oxides (TCOs) are transparent conductive materials, usually metal oxides such as zinc oxide, tin oxide, cadmium oxide, titanium oxide, indium oxide or indium tin oxide (ITO). In addition to binary metal oxygen compounds such as ZnO, SnO2 or In2O3, ternary metal oxygen compounds such as Zn2SnO4, CdSnO3, ZnSnO3, MgIn2O4, GaInO3, Zn2In2O5 or In4Sn3O12 or mixtures of different transparent conductive oxides also belong to the group of TCOs. Furthermore, the TCOs do not necessarily correspond to a stoichiometric composition and can also be p- or n-doped.

In an advantageous embodiment, the first current spreading structure comprises a contact layer. In an embodiment, the contact layer is a single layer which especially consists of a TCO, for example ITO. In an embodiment, the contact layer directly adjoins the first semiconductor layer. Moreover, the first current spreading structure may comprise a current spreading layer, which in particular consists of at least one transparent conductive oxide. The contact layer may be thinner than the current spreading layer.

In an advantageous configuration, the current spreading layer of the first current spreading structure is a multilayer comprising at least two sublayers. In an embodiment, the two sublayers differ in their material composition and/or thickness.

According to at least one embodiment, the second current spreading structure comprises a current spreading layer, which may consist of at least one transparent conductive oxide. In an embodiment, the current spreading layer of the second current spreading structure is a multilayer comprising at least two sublayers. Especially, the two sublayers differ in their material composition and/or thickness. The second current spreading structure may consist of the current spreading layer and may not comprise any further layers. The current spreading layer may be directly arranged on the first surface of the second semiconductor layer. In other words, there may be no further layer between the current spreading layer and the second semiconductor layer.

In an embodiment, during operation, charge carriers are impressed directly from the current spreading structures into the semiconductor layer sequence. In an embodiment, the first and second current spreading structures have a relatively small sheet resistance such that current crowding hardly occurs. A sheet resistance may be at most 45 Ohm/square, wherein deviations of 10% are tolerable.

It is an advantage of the device that on account of the TCOs used for the current spreading structures, absorption losses can be reduced and contact area can be increased with neglectable absorption losses. So, both the current spreading and the decoupling efficiency can be improved at the same time.

In an advantageous configuration, the first current spreading structure and the second current spreading structure are free of Au and/or Ag.

Suitable thicknesses of the current spreading layers are in a range between 5 nm and 500 nm, such as between 15 nm and 150 nm, or between 60 nm and 100 nm, wherein deviations of 10% are tolerable. The first and second current spreading layers may be multilayers each comprising at least two sublayers, which may be made of different TCO materials, for example one sublayer consisting of ZnO and one sublayer consisting of ITO. For example, the sublayer made of ZnO may be 15 nm thick, whereas the sublayer made of ITO may be 70 nm thick.

Moreover, suitable thicknesses of the contact layer of the first current spreading structure are in a range between 15 nm and 200 nm, such as between 20 nm and 90 nm, or between 50 nm and 70 nm, wherein deviations of 10% are tolerable.

In an embodiment of the optoelectronic semiconductor device, the first semiconductor layer is of a first conductivity type and the second semiconductor layer is of a second conductivity type. Especially, the first semiconductor layer is a p-doped layer, whereas the second semiconductor layer is an n-doped layer. In an embodiment, an active zone is located between the first semiconductor layer and the second semiconductor layer. More layers, doped or undoped layers, may be arranged between the first semiconductor layer and the active zone as well as between the second semiconductor layer and the active zone.

According to at least one embodiment, the active zone is provided for the generation of electromagnetic radiation. In this case, the term "electromagnetic radiation" refers in particular to infrared, visible and/or ultraviolet electromagnetic radiation. In particular, the active zone is provided for emitting blue or green light. During operation, a main portion of the radiation generated can be emitted laterally, which means at side faces of the optoelectronic semiconductor device. A smaller part of the radiation may be emitted on a top side of the optoelectronic semiconductor device.

Materials based on nitride compound semiconductors are suitable for the semiconductor layer sequence. "Based on nitride compound semiconductors" means in this context that at least one layer of the semiconductor layer sequence comprises a nitride III/V compound semiconductor material, such as $Al_nGa_mIn_{1-n-m}N$, where $0 \le n \le 1$, $0 \le m \le 1$ and $n+m \le 1$, without necessarily having a mathematically exact composition according to the above formula. Rather, it may contain one or more dopants and additional components that do not substantially alter the characteristic physical properties of the $Al_nGa_mIn_{1-n-m}N$ material. For the sake of simplicity, however, the above formula contains only the essential components of the crystal lattice (Al, Ga, In, N), even if these can be partially replaced by small amounts of other substances.

According to at least one embodiment, the optoelectronic semiconductor device comprises a carrier on which the semiconductor layer sequence is arranged. In particular, the carrier is a growth substrate on which the semiconductor layer sequence has been epitaxially deposited. In this context, "epitaxial deposition on the growth substrate" means that the growth substrate is used for deposition and/or growth of the semiconductor layer sequence. For example, the second semiconductor layer is in direct contact with the growth substrate.

The carrier or growth substrate may include or may consist of sapphire, SiC and/or GaN. In an embodiment, the growth substrate consists of sapphire, and the optoelectronic semiconductor device is a miniature sapphire flip chip. Within the context of the present application, "miniature" may refer to a size of about $200 \times 200$ $\mu m^2$ and/or a low operation current, which allows to skip a metallic current spreading layer, especially made of Au. The directionally reflective layer allows flipping of the device and significantly high reflection to emit radiation laterally and from the top.

According to an advantageous configuration, the carrier is patterned at a first surface, where the semiconductor layer sequence is arranged. The patterned first surface helps to increase the decoupling efficiency based on its roughness. Especially, the carrier is a patterned sapphire substrate, and the refractive index difference between the semiconductor layer sequence and the carrier is linearly reduced by a "transition layer" resulting at the first surface of the patterned carrier.

According to at least one embodiment, the directionally reflective layer comprises a dielectric material or consists of a dielectric material. The directionally reflective layer may be a single layer or a multilayer comprising at least two sublayers of a higher and lower refractive index. In an embodiment, the directionally reflective layer is a DBR (Distributed Bragg Reflector) layer. Suitable materials for the directionally reflective layer or the sublayers are oxides like SiO2, TiO2, Nb2O5, Al2O3, for example, or nitrides like Si3N4 or SiNx, for example, wherein "x" designates a non-stoichiometric amount of nitride, or fluorides like MgF2, for example. Suitable layer thicknesses of the directionally reflective layer are in the range between 500 nm to 6000 nm, such as in the range between 1000 nm to 5000 nm, or between 1500 nm to 4500 nm, wherein deviations of 10% are tolerable.

According to at least one embodiment, the contact layer and the current spreading layer of the first current spreading structure are spaced apart, especially in a vertical direction, and the directionally reflective layer is arranged between the contact layer and the current spreading layer. In this case, the first current spreading structure may comprise at least one via element, which electrically connects the current spreading layer to the contact layer. Alternatively, the current spreading layer may be directly arranged on the contact layer.

According to at least one embodiment, the first semiconductor layer comprises a recess, and the second semiconductor layer is arranged at a bottom of the recess. Especially, the current spreading layer of the second current spreading structure is arranged in the recess on the second semiconductor layer.

In an embodiment, the current spreading layer of the first current spreading structure partly laterally surrounds the current spreading layer of the second current spreading structure in a plan view on the first main surface. For example, the current spreading layer of the second current spreading structure may be formed in an elliptical, oval or strip-like manner and at least a part of the current spreading layer of the first current spreading structure facing the other current spreading layer may be curved and especially formed in a curved, especially U-like, manner.

According to at least one embodiment, the first contact structure comprises a first feedthrough element being arranged on a side of the first current spreading structure facing away from the semiconductor layer sequence. Moreover, the second contact structure comprises a second feedthrough element being arranged on a side of the second current spreading structure facing away from the semiconductor layer sequence. Advantageously, the feedthrough elements are metallic elements.

According to at least one embodiment, the first contact structure comprises a first bondpad being arranged on a side of the first feedthrough element facing away from the semiconductor layer sequence, and the second contact structure comprises a second bondpad being arranged on a side of the second feedthrough element facing away from the semiconductor layer sequence, wherein the first and second bondpads are provided for externally contacting the optoelectronic semiconductor device. Especially, the first and second bondpads are each metallic layers. The first and second bondpads may each comprise several layers. For example, the first and second bondpads may each comprise at least one of the following layers: an adhesion layer, a reflective layer, a barrier layer and an encapsulation layer. Suitable materials for the adhesion layer are, for example, Ti, Cr, Al, Mo, Ni or W. Suitable materials for the reflective layer are, for example, Ag, Al or Rh. Suitable materials for the barrier layer are, for example, Ti, Pt, Ni, Cr, Rh or Ru. And the encapsulation layer may, for example, comprise or consist of Au. In particular, the feedthrough elements are composed of the same material as the bondpads.

In an embodiment, the feedthrough elements are laterally surrounded by the directionally reflective layer, an additional directionally reflective layer or a passivation layer. Especially, the feedthrough elements are electrically isolated from each other by means of the directionally reflective layer, the additional directionally reflective layer or the passivation layer. The feedthrough elements and/or bondpads may have a non-neglectable impact on the overall reflection occurring in the device.

According to at least one embodiment, the optoelectronic semiconductor device further comprises an omnidirectionally reflective layer arranged on a side of the directionally reflective layer facing away from the semiconductor layer sequence. In the context of the present application, "omnidirectionally reflective" designates a reflection property which is characterized in that the radiation is mostly distributed regularly over all angles.

Especially, the omnidirectionally reflective layer is a metallic layer. The omnidirectionally reflective layer may include Al or Rh. The omnidirectionally reflective layer allows to increase reflection even at areas which are not covered by metallic elements, for example the bondpads.

In an embodiment, the omnidirectionally reflective layer is part of the first and second contact structures. The first contact structure comprises a first via element, which electrically connects the omnidirectionally reflective layer to the first current spreading structure, and the second contact structure comprises a second via element, which electrically connects the omnidirectionally reflective layer to the second current spreading structure. A passivation layer may be arranged on a side of the omnidirectionally reflective layer facing away from the directionally reflective layer. The passivation layer can be a single or a multilayer of dielectrics like $SiO_2$, $TiO_2$, $Al_2O_3$, $SiN_x$, Siliconoxynitride and $Nb_2O_5$.

According to at least one embodiment, the device comprises an additional directionally reflective layer, wherein the current spreading layer of the first current spreading structure is arranged between the directionally reflective layer and the additional directionally reflective layer. In this embodiment, direct incidence of radiation on metal elements like feedthrough elements or bondpads can be prevented and thus absorption can be reduced. The additional directionally reflective layer may be embodied like the directionally reflective layer as mentioned above.

According to at least one embodiment of a method for producing an optoelectronic semiconductor device, a semiconductor layer sequence is provided comprising a first semiconductor layer having a first surface, a second semiconductor layer having a first surface, a first main surface and a second main surface opposite to the first main surface. Moreover, a directionally reflective layer is applied on the first main surface. A first contact structure is produced for electrically connecting the first semiconductor layer comprising a first current spreading structure being arranged on the first surface of the first semiconductor layer and partly adjoining the at least one directionally reflective layer. A second contact structure is produced for electrically connecting the second semiconductor layer comprising a second current spreading structure being arranged on the first surface of the second semiconductor layer and partly adjoining the at least one directionally reflective layer. Especially, the first current spreading structure and the second current spreading structure are each made of at least one transparent conductive oxide.

According to one advantageous aspect of the method, a contact layer of the first current spreading structure is first deposited on the first main surface. Second, a recess is produced extending through the contact layer and the first semiconductor layer up to the second semiconductor layer. In an embodiment, the recess is produced by an etching method, for example by dry chemical etching. Third, a current spreading layer of the second current spreading structure is deposited in the recess on the second semiconductor layer. Especially, the contact layer and the current spreading layer are made of at least one transparent conductive oxide.

In an advantageous variant of the method, a current spreading layer of the first current spreading structure is applied to the contact layer. In an embodiment, the current spreading layer of the first current spreading structure and the current spreading layer of the second current spreading structure are produced in one method step. When producing openings for feedthrough elements in the directionally reflective layer, the current spreading layers may act as etch stop layers for the dry chemical etching. This sets a boundary condition for the layer thicknesses. If alternatively a lift-off structuring of the directionally reflective layer is applied, the etch stop layer and hence the current spreading layers' thicknesses are not limited.

According to at least one embodiment, during deposition of the current spreading layer(s), an oxygen flow is adjusted in such a way that an absorption coefficient of the current spreading layer(s) is as low as possible.

In accordance with a configuration, a first circumferential edge can be formed in the semiconductor layer sequence such that the second semiconductor layer laterally projects beyond the first semiconductor layer. Moreover, a second circumferential edge can be formed such that the carrier laterally projects beyond the second semiconductor layer. The lateral projections are for electrical isolation of the device's side wall. In detail, the second/first semiconductor layer is retreated from the edge of the carrier to create a safety distance. Without this safety distance, for example, an electrically conducting glue could contact the p-bondpad and the second semiconductor layer and hence provoke a short circuit. In an embodiment, the edges are produced by an etching method, for example by dry chemical etching.

The method described above is particularly suitable for the production of optoelectronic semiconductor devices described here. Features described in connection with the device thus also apply to the method and vice versa.

The optoelectronic semiconductor device as described can be applied as a backlight unit for an LCD (Liquid Crystal Device) panel.

BRIEF DESCRIPTION OF THE DRAWINGS

Further features, embodiments and advantages are given in the following description of the exemplified embodiments in conjunction with the figures, in which:

FIG. 9 shows a table where a relative generation of light is demonstrated in dependence on sheet resistance.

Figure 1:
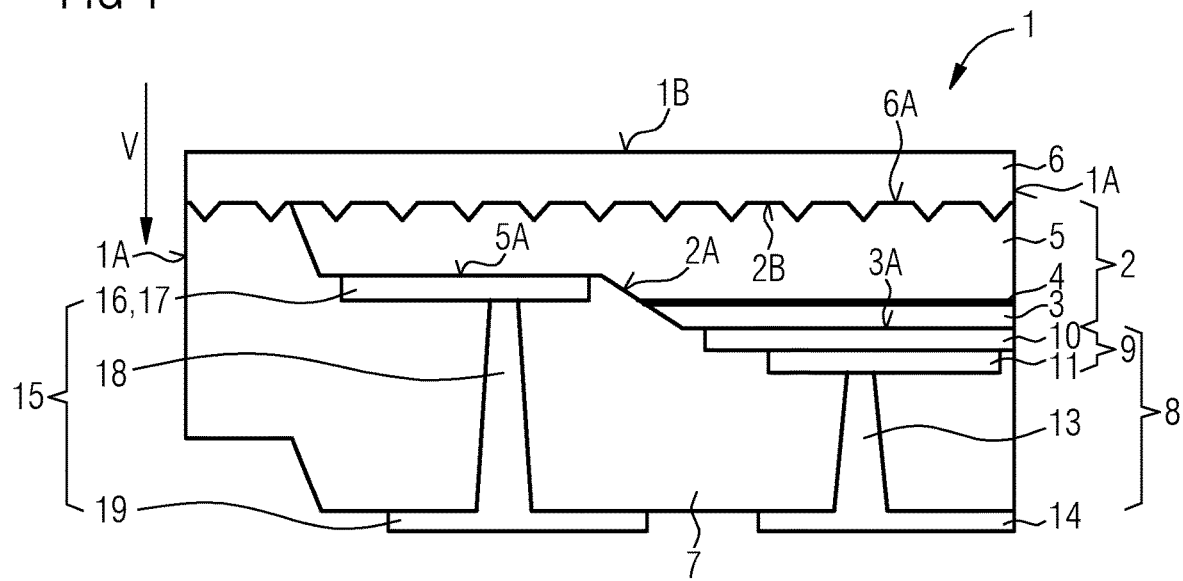
FIG. 1 shows a schematic cross-sectional view of a section of an optoelectronic semiconductor device according to a first embodiment.

In the exemplified embodiments and figures, identical, similar or similarly acting elements can each be provided with the same reference numerals. The elements shown and their proportions among each other are not necessarily to be regarded as true to scale; rather, individual elements may be oversized for better representability and/or better understanding.

DETAILED DESCRIPTION

Figure 4A:
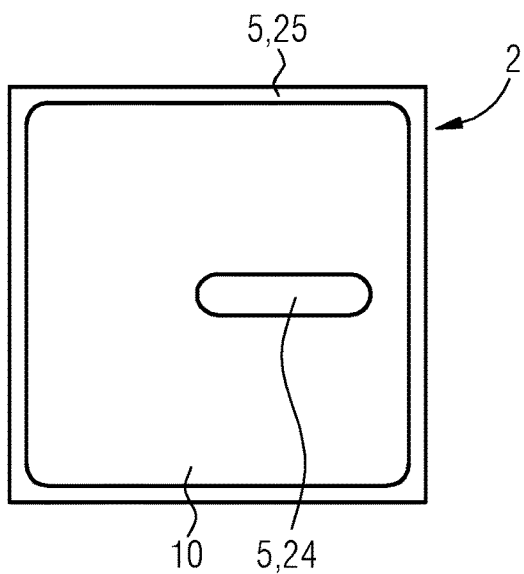
FIGS. 4A to 4E show different steps of a method for producing an optoelectronic semiconductor device according to a first embodiment.
Figure 4B:
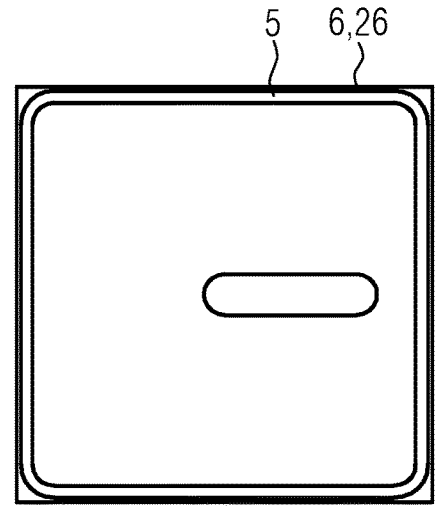
Figure 4C:
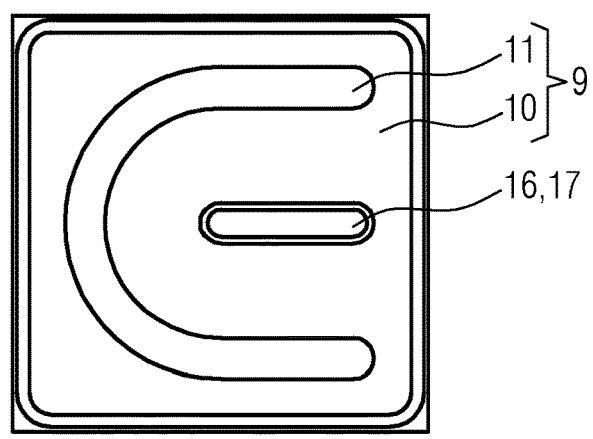
Figure 4D:
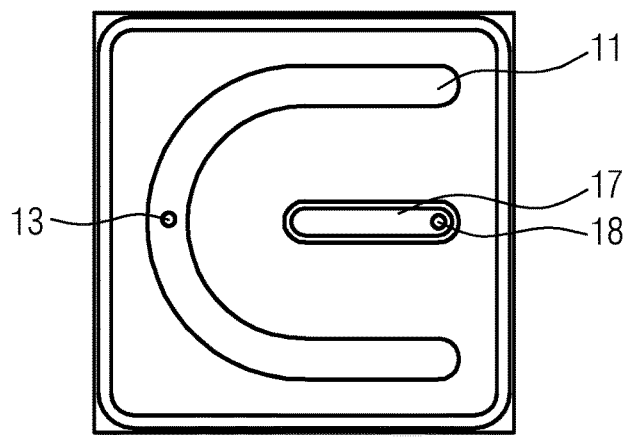
Figure 4E:
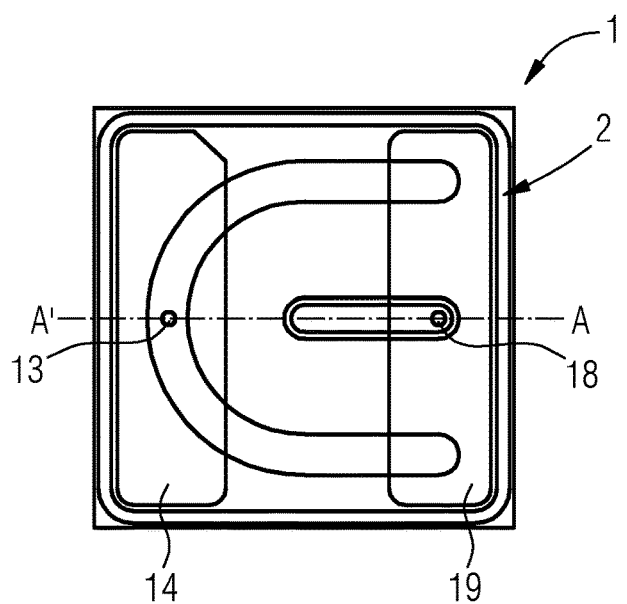

FIG. 1 shows a cross-sectional view of a section of an optoelectronic semiconductor device 1 along line AA' as indicated in FIG. 4E.

The optoelectronic semiconductor device 1 comprises a semiconductor layer sequence 2, which is arranged on a carrier 6. In the context of the present application, "being arranged on" means following in a non-parallel direction, such as in a vertical direction V.

The semiconductor layer sequence 2 comprises a first semiconductor layer 3, a second semiconductor layer 5 and an active zone 4 arranged between the first and second semiconductor layers 3, 5. The first semiconductor layer 3 has a first surface 3A facing away from the second semiconductor layer 5. The second semiconductor layer 5 has a first surface 5A facing away from the carrier 6.

The semiconductor layer sequence 2 has a first main surface 2A and a second main surface 2B opposite to the first main surface 2A. And the first surfaces 3A, 5A of the first and second semiconductor layers 3, 5 are at least partly arranged at the first main surface 2A of the semiconductor layer sequence 2. Especially, a part of the first surface 5A of the second semiconductor layer 5 is covered by the active zone 4 and the first semiconductor layer 3 and therefore is not arranged at the first main surface 2A.

Moreover, the optoelectronic semiconductor device 1 comprises a directionally reflective layer 7 arranged on the first main surface 2A.

Furthermore, the optoelectronic semiconductor device 1 comprises a first contact structure 8 and a second contact structure 15, wherein the first contact structure 8 comprises a first current spreading structure 9 and the second contact structure 15 comprises a second current spreading structure 16. The first current spreading structure 9 is arranged on the first surface 3A of the first semiconductor layer 3 and partly adjoins the directionally reflective layer 7. The second current spreading structure 16 is arranged on the first surface 5A of the second semiconductor layer 5 and partly adjoins the directionally reflective layer 7. Especially, the first current spreading structure 9 comprises a contact layer 10 and a current spreading layer 11, wherein the contact layer 10 is directly arranged on the first surface 3A of the first semiconductor layer 3 and the current spreading layer 11 is directly arranged on the contact layer 10. Moreover, the second current spreading structure 16 comprises, or consists of, a current spreading layer 17, which is directly arranged on the first surface 5A of the second semiconductor layer 5.

In addition, the first contact structure 8 comprises a bondpad 14 and a feedthrough element 13, wherein the feedthrough element 13 is arranged between the first current spreading structure 9 and the bondpad 14. And the second contact structure 15 comprises a bondpad 19 and a feedthrough element 18, wherein the feedthrough element 18 is arranged between the second current spreading structure 16 and the bondpad 19. The feedthrough elements 13, 18 are arranged in openings of the directionally reflective layer 7.

The contact structures 8, 15 are arranged on a same side of the optoelectronic semiconductor device 1. Especially, the optoelectronic semiconductor device 1 has a flip-chip design and can be mounted upside down on a circuit board, for example.

The first current spreading structure 9 and the second current spreading structure 16 each consist of at least one transparent conductive oxide. The current spreading layers 11, 17 can each be a single layer or a multilayer consisting of TCO(s). Sublayers of the multilayer may differ in their material composition and/or thickness. Suitable thicknesses of the current spreading layers 11, 17 are in a range between 5 nm and 500 nm, such as between 15 nm and 150 nm, or between 60 nm and 100 nm, wherein deviations of 10% are tolerable. For example, one sublayer consists of ZnO and one sublayer consists of ITO. For example, the sublayer made of ZnO may be 15 nm thick, whereas the sublayer made of ITO may be 70 nm thick. Especially, the current spreading layers 11, 17 of the current spreading structures 9, 16 are identical. Here, the thickness is an extension in the vertical direction V.

The contact layer 10 may be a single layer consisting of TCO, such as ITO. Especially, the contact layer 10 is different from the current spreading layer 11 of the first current spreading structure 9 with respect to its material composition and/or thickness. The contact layer 10 may be thinner than the current spreading layer 11 of the first current spreading structure 9. Suitable thicknesses of the contact layer 10 are in a range between 15 nm and 200 nm, such as between 20 nm and 90 nm, or between 50 nm and 70 nm, wherein deviations of 10% are tolerable.

The directionally reflective layer 7 is a multilayer comprising a plurality of sublayers with different refractive indices, wherein a sublayer of a lower refractive index is arranged between two sublayers of a higher refractive index. In an embodiment, the directionally reflective layer 7 is a DBR (Distributed Bragg Reflector) layer. Suitable materials for the directionally reflective layer 7 or the sublayers are oxides like SiO2, TiO2, Nb2O5, Al2O3, for example, or nitrides like Si3N4 or SiNx, for example, wherein "x" designates a non-stoichiometric amount of nitride, or fluorides like MgF2, for example. Suitable layer thicknesses of the directionally reflective layer 7 are in the range between 500 nm to 6000 nm, such as in the range between 1000 nm to 5000 nm, or between 1500 nm to 4500 nm, wherein deviations of 10% are tolerable.

The semiconductor layer sequence 2 may include a material based on nitride compound semiconductors as mentioned above. And the active zone 4 is adapted for emitting blue or green light.

The carrier 6, which may be the growth substrate, in particular consists of sapphire. The carrier 6 is patterned at a first surface 6A, where the semiconductor layer sequence 2 is arranged. The patterned first surface 6A helps to increase the decoupling efficiency based on its roughness because the refractive index difference between the semiconductor layer sequence 2 and the carrier 6 is linearly reduced by a "transition layer" resulting at the first surface 6A of the carrier 6.

The feedthrough elements 13, 18 are metallic elements. Moreover, the first and second bondpads 14, 19 may be metallic layers having a thickness of 100 nm to 1500 nm. The metallic feedthrough elements 13, 18 and bondpads 14, 19 help to broaden the angular distribution of the reflected radiation.

The first and second bondpads 14, 19 may each comprise several layers. For example, the first and second bondpads 14, 19 may each comprise at least one of the following layers: an adhesion layer may have a thickness of about 1 to 10 nm, a reflective layer may have a thickness of about 100 to 600 nm, a barrier layer and an encapsulation layer. Suitable materials for the adhesion layer are, for example, Ti, Cr, Al, Mo, Ni or W. Suitable materials for the reflective layer are, for example, Ag, Al or Rh. Suitable materials for the barrier layer are, for example, Ti, Pt, Ni, Cr, Rh or Ru. And the encapsulation layer may, for example, comprise or consist of Au.

Advantageously, the optoelectronic semiconductor device 1 is a miniature sapphire flip chip having a size of about 200×200 μm² and/or a low operation current of about 10 mA, which allows to skip a metallic current spreading layer, especially made of Au. During operation, a main portion of the radiation generated can be emitted laterally, which means at side faces 1A of the optoelectronic semiconductor device 1. A smaller part of the radiation may be emitted at a top side 1B of the optoelectronic semiconductor device 1. The directionally reflective layer 7 allows flipping of the device 1 and significantly high reflection to emit radiation laterally and from the top.

The first contact structure 8 is provided for electrically connecting the first semiconductor layer 3, whereas the second contact structure 15 is provided for electrically connecting the second semiconductor layer 5. Especially, the first and second contact structures 8, 15 are electrically isolated by means of the directionally reflective layer 7. The first and second bondpads 14, 19 are provided for externally contacting the optoelectronic semiconductor device 1.

It is an advantage of the device 1 that on account of the TCOs used for the current spreading structures 9, 16, absorption losses at the contact structures 8, 15 can be reduced and contact area can be increased with neglectable absorption losses. So, both the current spreading and the decoupling efficiency can be improved at the same time.

Figure 2:
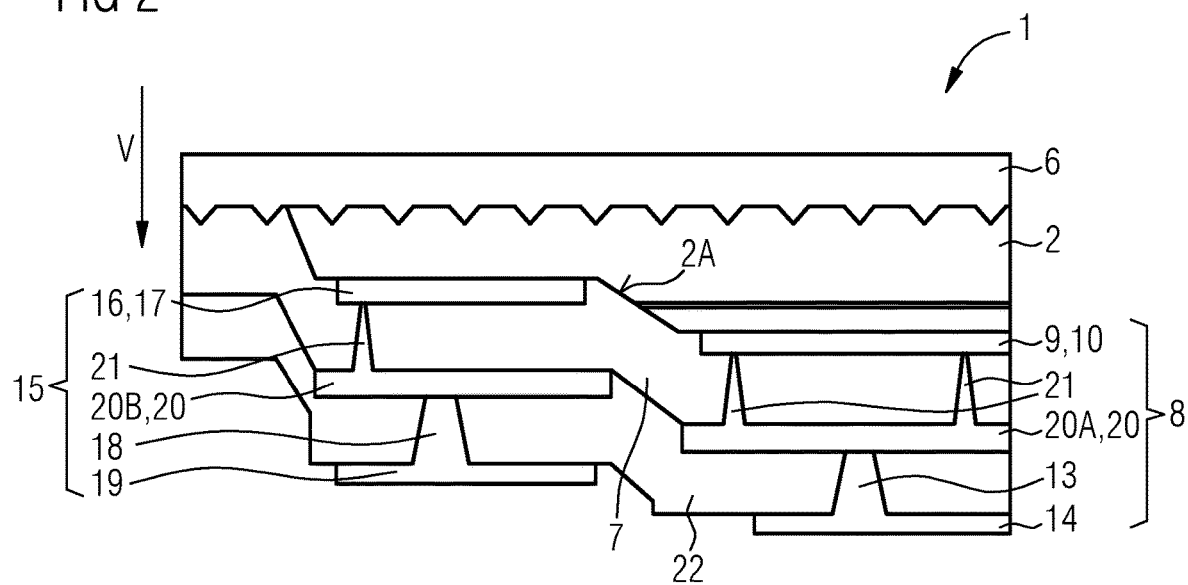
FIG. 2 shows a schematic cross-sectional view of a section of an optoelectronic semiconductor device according to a second embodiment.

FIG. 2 shows a second embodiment of an optoelectronic semiconductor device 1. In the following the differences to the first embodiment will be explained.

The optoelectronic semiconductor device 1 comprises an omnidirectionally reflective layer 20 arranged on a side of the directionally reflective layer 7 facing away from the semiconductor layer sequence 2. Especially, the omnidirectionally reflective layer 20 is a metallic layer, which covers a major part of the first main surface 2A. The omnidirectionally reflective layer 20 may include Al or Rh. The omnidirectionally reflective layer 20 allows to increase reflection even at areas which are not covered by metallic elements, for example the bondpads 14, 19.

In particular, the omnidirectionally reflective layer 20 is part of the first and second contact structures 8, 15 and is arranged between the respective current spreading structure 9, 16 and the respective feedthrough element 13, 18. To prevent a shirt circuit between the contact structures 8, 15, the omnidirectionally reflective layer 20 comprises a first part 20A and a second part 20B, which are separate from each other.

The first contact structure 8 comprises several via elements 21, which electrically connect the omnidirectionally reflective layer 20 to the first current spreading structure 9, and the second contact structure 15 comprises a second via element 21, which electrically connects the omnidirectionally reflective layer 20 to the second current spreading structure 16. As the omnidirectionally reflective layer 20 provides for good current spreading, there is no need for a current spreading layer in the first current spreading structure 9.

A passivation layer 22 is arranged on a side of the omnidirectionally reflective layer 20 facing away from the directionally reflective layer 7. The passivation layer 22 can be a single or a multilayer of dielectrics like SiO2, TiO2, Al2O3, SiNx, Siliconoxynitride and Nb2O5. The passivation layer 22 separates the omnidirectionally reflective layer 20 from the bondpads 14, 19 electrically, which is necessary to avoid a short circuit as, for example, the n-bondpad 19 can be on top of part 20A of the omnidirectionally reflective layer 20 in the vertical direction V.

Figure 3:
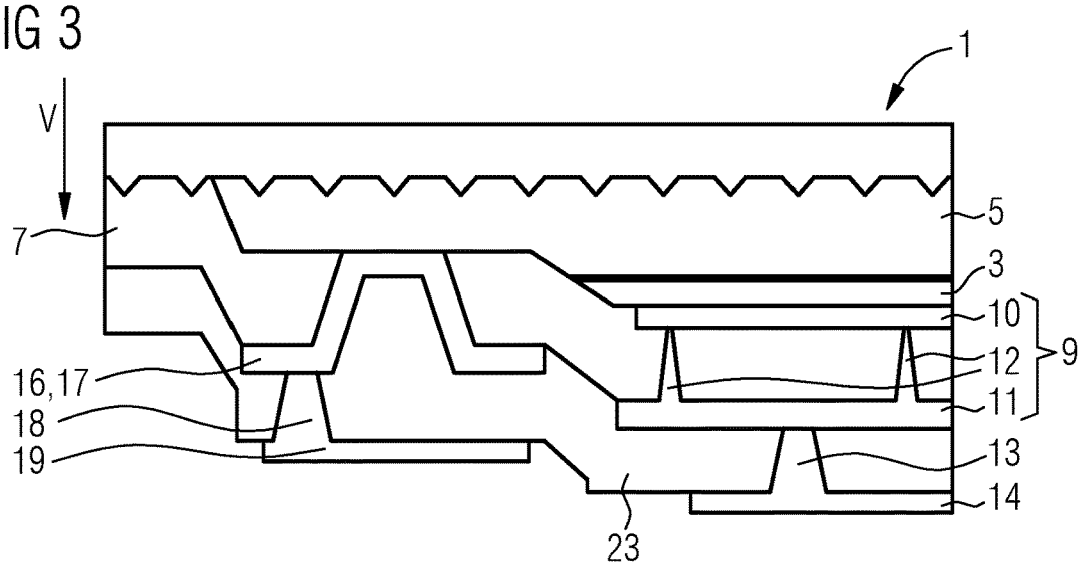
FIG. 3 shows a schematic cross-sectional view of a section of an optoelectronic semiconductor device according to a third embodiment.

FIG. 3 shows a third embodiment of an optoelectronic semiconductor device 1. In the following the differences to the first embodiment will be explained.

The current spreading layers 11, 17 are locally stacked on the directionally reflective layer 7. This allows to avoid direct metal contact to the second semiconductor layer 5 or the contact layer 10 and hence reduce absorption. In other words, the current spreading layers 11, 17 shield the metallic elements 13, 14, 18, 19 from direct incidence of radiation, and thus absorption can be reduced.

The contact layer 10 and the current spreading layer 11 of the first current spreading structure 9 are spaced apart in the vertical direction V, and the directionally reflective layer 7 is arranged between the contact layer 10 and the current spreading layer 11. The first current spreading structure 9 comprises several via elements 12, which electrically connect the current spreading layer 11 to the contact layer 10.

The device 1 comprises an additional directionally reflective layer 23, wherein the current spreading layer 11 of the first current spreading structure 9 is arranged between the directionally reflective layer 7 and the additional directionally reflective layer 23. The additional directionally reflective layer 23 may be embodied like the directionally reflective layer 7 as mentioned above. A multilayer embodiment of the additional directionally reflective layer 23 is beneficial for light reflection at the n-bondpad 19.

In connection with FIGS. 4A to 4E, a method according to a first embodiment for producing an optoelectronic semiconductor device 1 is described. The method is particularly suitable for producing an optoelectronic semiconductor device 1 according to the first embodiment.

A semiconductor layer sequence 2 is provided and a contact layer 10 of a first current spreading structure 9 is deposited on a first main surface of a first semiconductor layer (see FIG. 4A).

A recess 24 is produced extending through the contact layer 10 and the first semiconductor layer up to the second semiconductor layer 5 (see FIG. 4A). The recess 24 is laterally surrounded by the first semiconductor layer. The recess 24 for example has an oval or elliptical cross-sectional shape.

Moreover, a first circumferential edge 25 is formed in the semiconductor layer sequence 2 such that the second semiconductor layer 5 laterally projects beyond the first semiconductor layer (see FIG. 4A). Moreover, a second circumferential edge 26 can be formed such that the carrier 6 laterally projects beyond the second semiconductor layer 5 (see FIG. 4B). This lateral projection is for electrical isolation of the device's side wall. In detail, the second semiconductor layer 5 is retreated from the edge of the carrier 6 to create a safety distance. Without this safety distance, an electrically conducting glue could contact the p-bondpad and the second semiconductor layer 2 and hence provoke a short circuit. In an embodiment, the recess 24 and the edges 25, 26 are produced by an etching method, for example by dry chemical etching.

A current spreading layer 17 of the second current spreading structure 16 is deposited in the recess 24 on the second semiconductor layer (see FIG. 4C). The current spreading layer 17 may be formed in a strip-like manner and have, like the recess 24, an oval or elliptical shape. A current spreading layer 11 of the first current spreading structure 9 is applied to the contact layer 10. In an embodiment, the current spreading layers 11, 17 are produced in one method step. In particular, during deposition of the current spreading layers 11, 17 an oxygen flow is adjusted in such a way that an absorption coefficient of the current spreading layers 11, 17 is as low as possible. This is described in more detail in connection with FIG. 7.

The current spreading layer 11 partly laterally surrounds the current spreading layer 17 in a plan view on the first main surface. The current spreading layer 11 is formed in a curved, especially U-like, manner.

A directionally reflective layer is applied on the first main surface (not shown). Openings for feedthrough elements 13, 18 are produced in the directionally reflective layer. Advantageously, the current spreading layers 11, 17 may act as etch stop layers for the dry chemical etching. Alternatively, the openings can be produced by a lift-off structuring. The feedthrough elements 13, 18 are deposited in the openings (see FIG. 4D). Especially, the feedthrough elements 13, 18 are deposited galvanically.

A first bondpad 14 is arranged on a side of the first feedthrough element 13 facing away from the semiconductor layer sequence 2 and a second bondpad 19 is arranged on a side of the second feedthrough element 18 facing away from the semiconductor layer sequence 2. Especially, the bondpads 14, 19 are deposited galvanically. The current spreading layer 11 is laterally overlapping with the bondpads 14, 19 in a plan view on the first main surface. Moreover, the current spreading layer 17 is laterally overlapping with bondpad 19 in a plan view on the first main surface.

Concerning structural and material properties of the semiconductor layer sequence 2, the contact layer 10, the current spreading layers 11, 17, the directionally reflective layer, the feedthrough elements 13, 18 and the bondpads 14, 19, reference is made to the specifications in connection with the optoelectronic semiconductor device 1 as mentioned above.

In connection with FIGS. 5A to 5E, a second embodiment of a method for producing an optoelectronic semiconductor device 1 is described. In the following the differences to the first embodiment of a method will be explained.

Figure 5A:
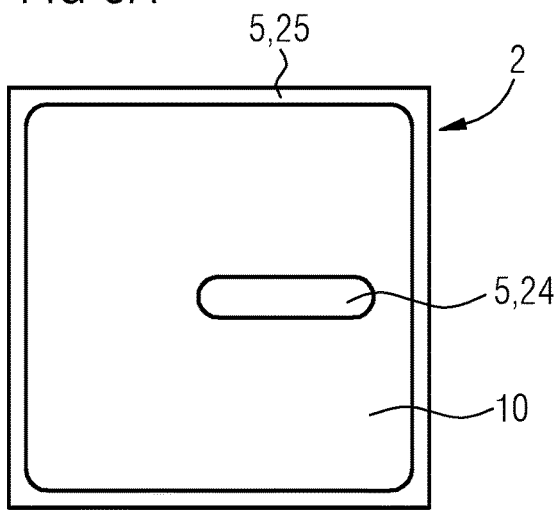
FIGS. 5A to 5E show different steps of a method for producing an optoelectronic semiconductor device according to a second embodiment.
Figure 5B:
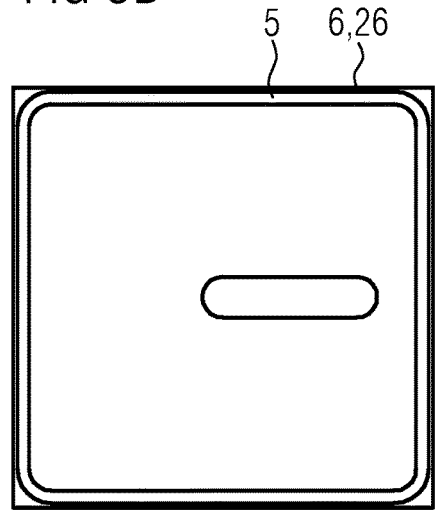
Figure 5C:
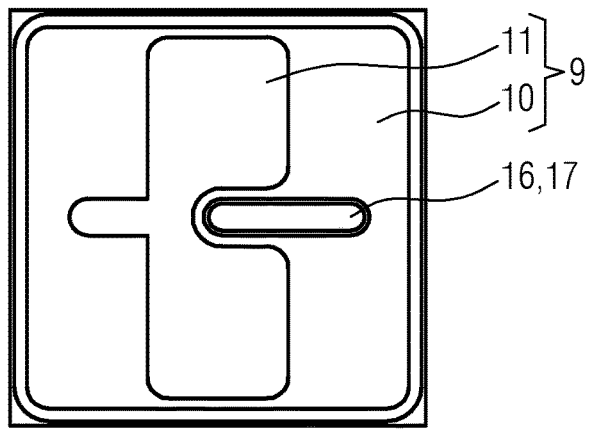
Figure 5D:
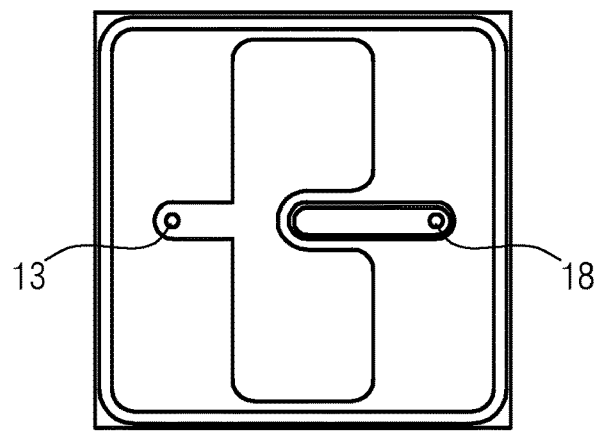
Figure 5E:
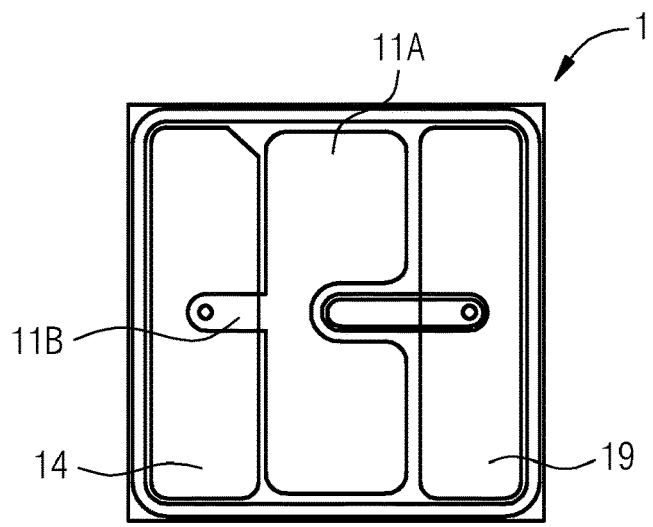

The current spreading layer 11 comprises a main region 11A arranged between the p- and n-bondpads 14, 19 in a plan view on the first main surface (see FIG. 5E). Moreover, the current spreading layer 11 comprises an extension 11B laterally overlapping with the bondpad 14. Since the stack of the directionally reflective layer and the respective bondpad 14, 19 creates an omnidirectionally reflective layer stack having a certain reflectivity, and the stack of the directionally reflective layer and the main region 11A creates an omnidirectionally reflective layer stack having a different reflectivity, if the main region 11A is optically active, the non-overlapping arrangement helps to optimize reflectivity for the different stacks.

Figure 6:
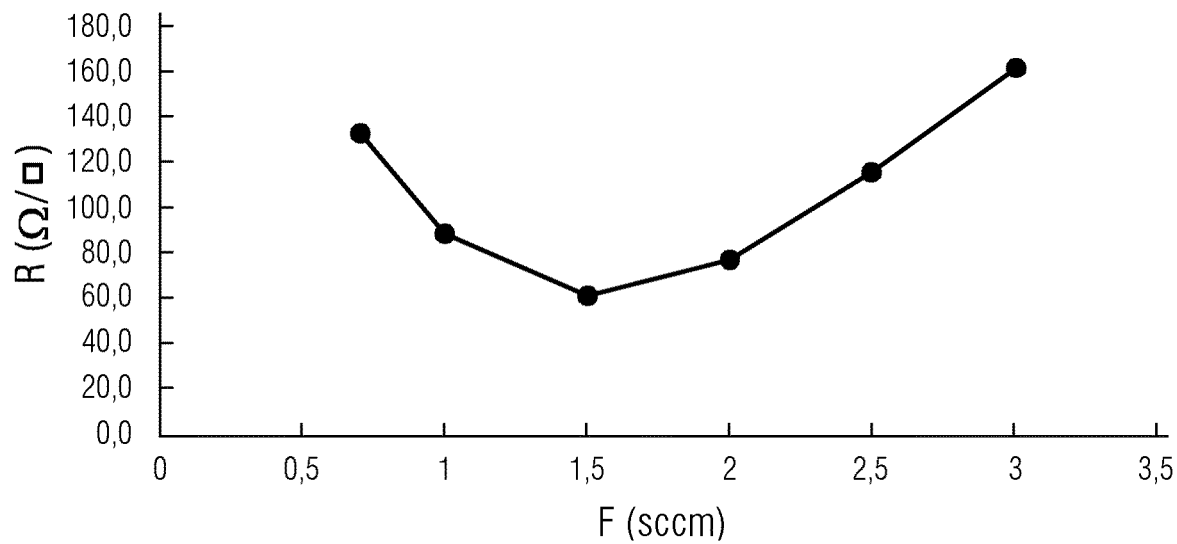
FIG. 6 shows a diagram where a sheet resistance is plotted against an oxygen flow.
Figure 7:
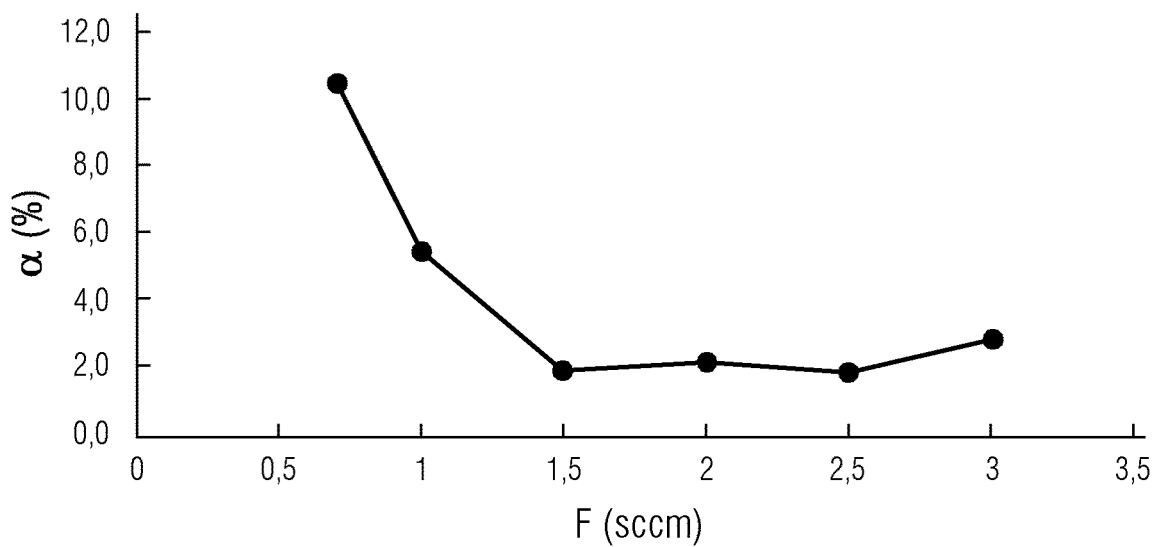
FIG. 7 shows a diagram where an absorption coefficient is plotted against an oxygen flow, FIGS. 8A to 8D each show a distribution of sheet resistance on the first main surface of a semiconductor layer sequence.

In FIGS. 6 and 7, physical properties, namely sheet resistance R [Ω/□], wherein □ designates "square", and absorption coefficient α [%], of a 70 mm thick current spreading layer of ITO with 10% Sn amount are shown in dependency on oxygen flow F [sccm], which designates standard cubic metres, at sputtering. In the case of FIG. 6, the current spreading layer is applied to an Si substrate, whereas in the case of FIG. 7, the current spreading layer is applied to a glass substrate.

At an oxygen flow F of ~1.5 sccm, the sheet resistance R and the absorption coefficient α for a wavelength of 450 nm are at a minimum. Especially, the absorption coefficient drops to ~2%. In contrast, the reflection coefficient in air of a conventional spreading layer comprising Al is only ~93%. Moreover, this value drops in the LED chip, where Al is applied on GaN and the reflectivity decreases to ~86%.

Basically, the n-current spreading layer defines the n-contact area. For the conventional flip chip technology, the n-contact area and its reflection of ~86%, which affects the device's brightness, are linked. For example, a larger n-contact area allows to reduce the voltage contribution of the n-contact, but increases the absorption loss at the Al layer.

In contrast, the transparent TCO n-current spreading layer allows to increase the n-contact area with neglectable absorption. The voltage and the brightness are not linked anymore, which offers an additional degree of freedom.

Figure 8A:
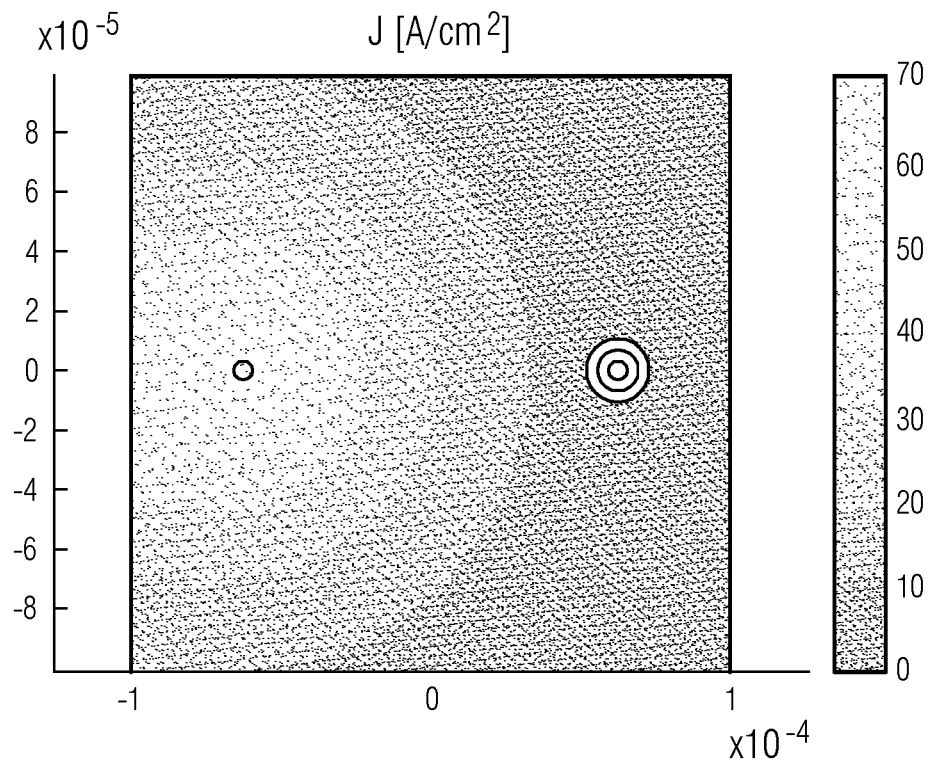
Figure 8B:
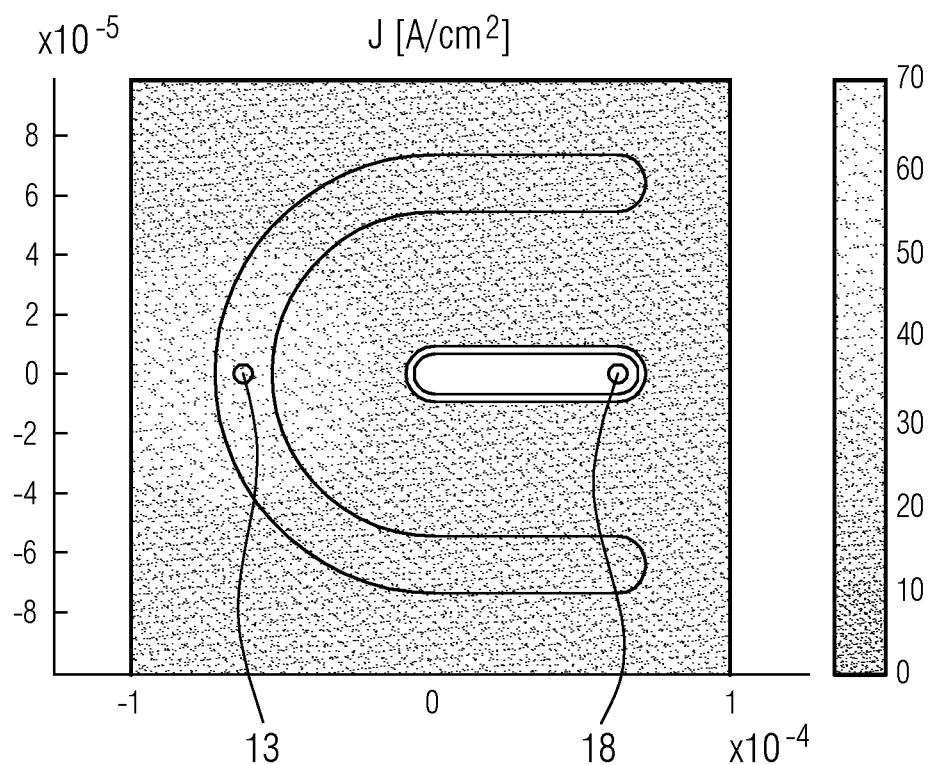
Figure 8C:
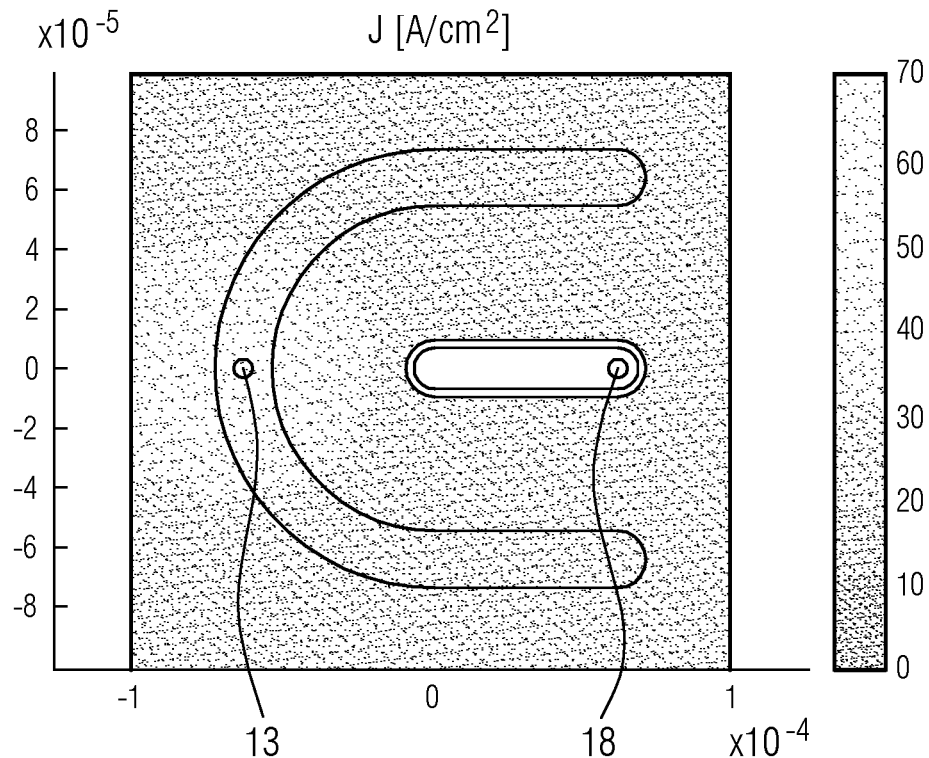
Figure 8D:
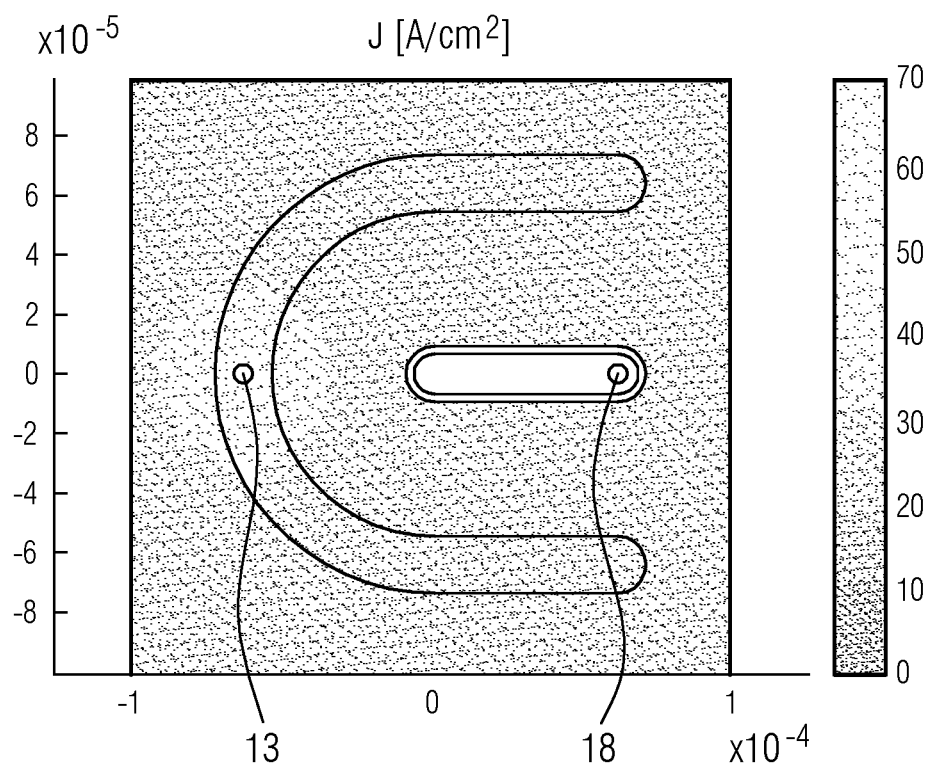

FIGS. 8B to 8D show electrooptical simulations of a chip design in accordance with the first embodiments of an optoelectronic semiconductor device and method. The pixel density depicts the current density J [A/cm$^2$]. FIG. 8A shows the current density of a device having no TCO p- and n-current spreading layer and hence massive current crowding near the p-feedthrough. FIG. 8B shows the current density J of an optoelectronic semiconductor device having a TCO p- and n-current spreading layer with a sheet resistance of 43 Ohm/square. FIG. 8C shows the current density J of an optoelectronic semiconductor device having a TCO p- and n-current spreading layer with a sheet resistance R of 21 Ohm/square. FIG. 8D shows the current density J of an optoelectronic semiconductor device having a TCO p- and n-current spreading layer with a sheet resistance R of 8 Ohm/square. The lower the sheet resistance R, the less current crowding appears.

The table in FIG. 9 demonstrates the voltage Uf (10 mA) [V] and relative created light O [%] for the different sheet resistances R of the examples shown in FIGS. 8A to 8D. The voltage Uf drops and the brightness O increases due to the "droop" effect of InGaN-based LEDs, which is related to the current density J.

The scope of protection of the invention is not limited to the examples given hereinabove. The invention is embodied in each novel characteristic and each combination of characteristics, which particularly includes every combination of any features which are stated in the claims, even if this feature or this combination of features is not explicitly stated in the claims or in the examples.

REFERENCES 1 optoelectronic semiconductor device
1A side face
1B top side
2 semiconductor layer sequence
2A first main surface
2B second main surface
3 first semiconductor layer
3A first surface of first semiconductor layer
4 active zone
5 second semiconductor layer
5A first surface of second semiconductor layer
6 carrier
6A first surface
7 directionally reflective layer
8 first contact structure
9 first current spreading structure
10 contact layer of first current spreading structure
11 current spreading layer of first current spreading structure
11A main region of current spreading layer
11B extension of current spreading layer
12 via element of first current spreading structure
13 feedthrough element of first contact structure
14 bondpad of first contact structure
15 second contact structure
16 second current spreading structure
17 current spreading layer of second current spreading structure
18 feedthrough element of second contact structure
19 bondpad of second contact structure
20 omnidirectionally reflective layer
20A first part of omnidirectionally reflective layer
20B second part of omnidirectionally reflective layer
21 via element
22 passivation layer
23 directionally reflective layer
24 recess
25 first circumferential edge
26 second circumferential edge
α absorption coefficient
F flow
J current density
O relative created light
R sheet resistance
Uf voltage
V vertical direction

The invention claimed is:

1. An optoelectronic semiconductor device comprising:
a semiconductor layer sequence comprising:
a first semiconductor layer having a first surface
a second semiconductor layer having a first surface
a first main surface and a second main surface opposite to the first main surface, wherein the first surfaces of the first semiconductor layer and the second semiconductor layer are at least partly arranged at the first main surface;
a directionally reflective layer being arranged on the first main surface;
a first contact structure for electrically connecting the first semiconductor layer comprising a first current spreading structure being arranged on the first surface of the first semiconductor layer and partly adjoining the at least one directionally reflective layer; wherein the first current spreading structure comprises a current spreading layer and a contact layer, wherein the contact layer is a single layer and directly adjoins the first semiconductor layer, and
a second contact structure for electrically connecting the second semiconductor layer comprising a second current spreading structure being arranged on the first surface of the second semiconductor layer and partly adjoining the at least one directionally reflective layer; wherein the first current spreading structure and the second current spreading structure each consist of at least one transparent conductive oxide, and wherein the contact layer is different from the current spreading layer with respect to its material composition and thickness.

2. The optoelectronic semiconductor device according to claim 1, wherein the current spreading layer consists of at least one transparent conductive oxide.

3. The optoelectronic semiconductor device according to claim 1, wherein the current spreading layer is a multilayer comprising at least two sublayers, wherein the two sublayers differ in their material composition and/or thickness.

4. The optoelectronic semiconductor device according to claim 1, wherein the contact layer and the current spreading layer are spaced apart, and the directionally reflective layer is arranged between the contact layer and the current spreading layer.

5. The optoelectronic semiconductor device according to claim 1, wherein the second current spreading structure comprises a current spreading layer, which consists of at least one transparent conductive oxide.

6. The optoelectronic semiconductor device according to claim 5, wherein the current spreading layer of the second current spreading structure is a multilayer comprising at least two sublayers, wherein the two sublayers differ in their material composition and/or thickness.

7. The optoelectronic semiconductor device according to claim 5, wherein the current spreading layer of the first current spreading structure partly laterally surrounds the current spreading layer of the second current spreading structure in a plan view on the first main surface.

8. The optoelectronic semiconductor device according to claim 1, further comprising an omnidirectionally reflective layer arranged on a side of the directionally reflective layer facing away from the semiconductor layer sequence.

9. The optoelectronic semiconductor device according to claim 8, wherein the omnidirectionally reflective layer is part of the first contact structure and the second contact structure.

10. The optoelectronic semiconductor device according to claim 1, wherein the first semiconductor layer comprises a recess, and the second semiconductor layer is arranged at a bottom of the recess.

11. The optoelectronic semiconductor device according to claim 1, wherein the contact layer is thinner than the current spreading layer.

12. A method for producing an optoelectronic semiconductor device; wherein the method comprises:
providing a semiconductor layer sequence comprising:
a first semiconductor layer having a first surface;
a second semiconductor layer having a first surface;
a first main surface and a second main surface opposite to the first main surface;
applying a directionally reflective layer on the first main surface;
producing a first contact structure for electrically connecting the first semiconductor layer comprising a first current spreading structure being arranged on the first surface of the first semiconductor layer and partly adjoining the at least one directionally reflective layer, wherein the first current spreading structure comprises a current spreading layer and a contact layer, wherein the contact layer is a single layer and directly adjoins the first semiconductor layer;
producing a second contact structure for electrically connecting the second semiconductor layer comprising a second current spreading structure being arranged on the first surface of the second semiconductor layer and partly adjoining the at least one directionally reflective layer; wherein the first current spreading structure and the second current spreading structure are each made of at least one transparent conductive oxide, and wherein the contact layer is different from the current spreading layer with respect to its material composition and thickness.

13. The method according to claim 12, further comprising:
depositing the contact layer of the first current spreading structure on the first main surface
producing a recess extending through the contact layer and the first semiconductor layer up to the second semiconductor layer; and
depositing a current spreading layer of the second current spreading structure in the recess on the second semiconductor layer, wherein the contact layer and the current spreading layer of the second current spreading structure are made of at least one transparent conductive oxide.

14. The method according to claim 13, wherein, during deposition of the current spreading layer of the second current spreading structure an oxygen flow is adjusted in such a way that an absorption coefficient of the current spreading layer is as low as possible.

15. The method according to claim 12, wherein the current spreading layer of the first current spreading structure is applied to the contact layer.

16. The method according to claim 13, wherein the current spreading layer of the first current spreading structure and the current spreading layer of the second current spreading structure are produced in one method step.

* * * * *